United States Patent [19]

Sexton

[11] 3,969,679

[45] July 13, 1976

[54] AUTOMATIC CROSSOVER DISTORTION CORRECTION CIRCUIT

[75] Inventor: Charles W. Sexton, Portsmouth, Va.

[73] Assignee: General Electric Company, Portsmouth, Va.

[22] Filed: July 26, 1974

[21] Appl. No.: 492,344

[52] U.S. Cl. .................................. 330/22; 330/17; 330/19; 330/23
[51] Int. Cl.² .......................................... H03F 3/04
[58] Field of Search ............... 330/13, 17, 19, 22, 330/23

[56] References Cited
UNITED STATES PATENTS

| | | | |
|---|---|---|---|
| 3,551,832 | 12/1970 | Graeme | 330/17 |
| 3,683,112 | 8/1972 | Nettleship | 330/23 X |

OTHER PUBLICATIONS

H. W. Parmer "Two Easy Ways to Stabilize Power—Transistor Hi–fi Amplifiers," *Electronics*, pp. 56–58, Oct. 26, 1962.

*Primary Examiner*—R. V. Rolinec
*Assistant Examiner*—Lawrence J. Dahl

[57] ABSTRACT

A biasing circuit for a complementary symmetry transistor amplifier utilizing a control transistor is disclosed in which the base terminal of the control transistor is connected to the base terminal of one of the complementary transistors so that the bias current drawn by the amplifier transistors is the control current for the control transistor. A bias voltage establishing network includes one element connected between the emitter and collector terminals of the control transistor so that the bias voltage is coupled via the emitter-base junction of the control transistor to the complementary transistors and thus the bias current drawn by the complementary symmetry amplifier determines the degree of conduction of the control transistor and therefore the bias voltage applied to the amplifier. In this manner sufficient bias voltage is applied to the amplifier to maintain conduction to avoid crossover distortion and at the same time the current drawn by the amplifier is limited to prevent thermal runaway.

3 Claims, 1 Drawing Figure

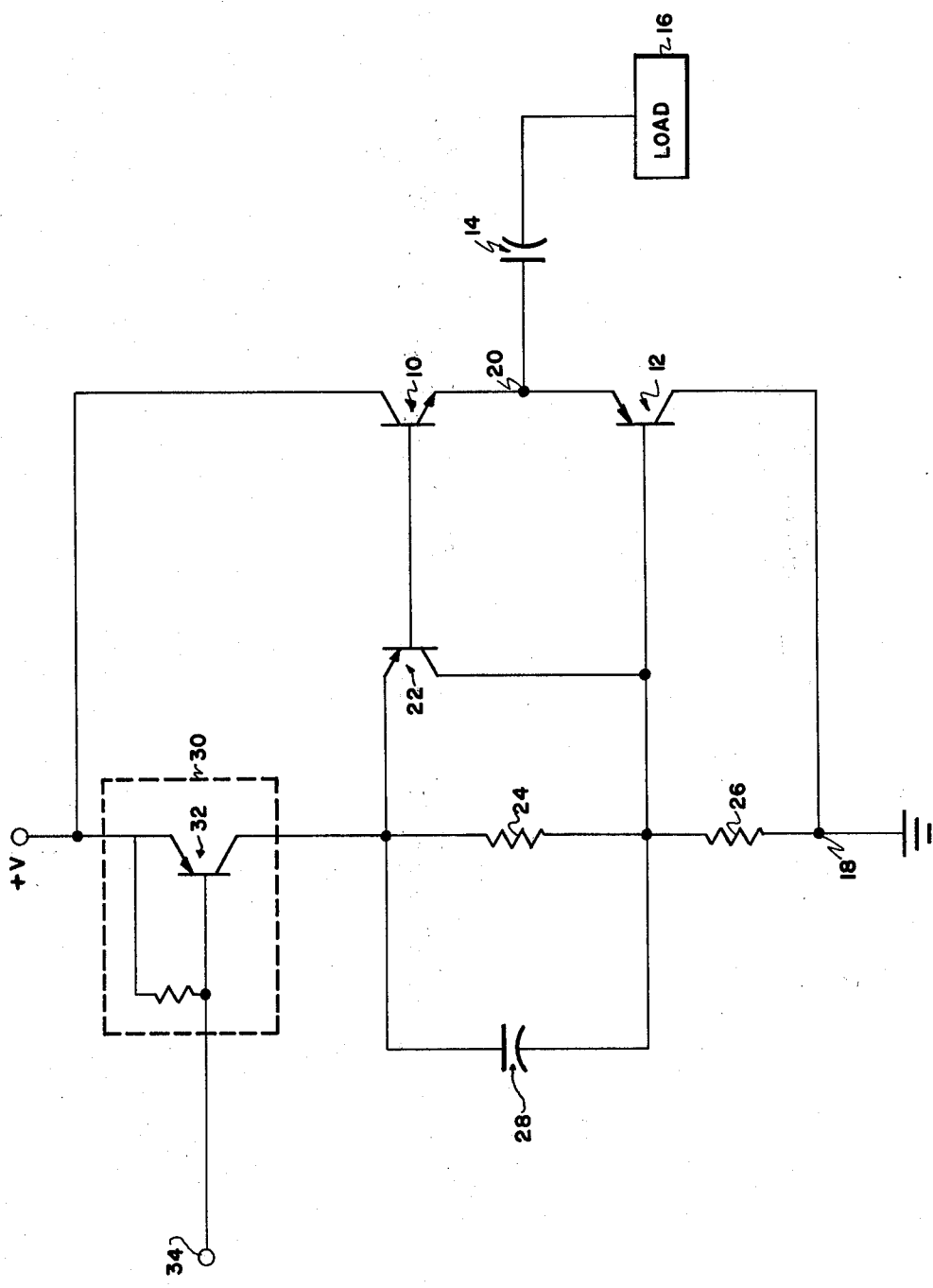

AUTOMATIC CROSSOVER DISTORTION CORRECTION CIRCUIT

BACKGROUND OF THE INVENTION

The present invention relates generally to complementary symmetry amplifier circuits and more particularly to a biasing arrangement for a complementary symmetry amplifier.

In complementary symmetry amplifier circuits such as that generally found in the vertical sweep output circuit of a television receiver, two active devices, i.e., transistors of opposite conductivity are arranged to operate as emitter followers for delivering output current to a load (the vertical deflection windings). The transistors are biased so that approximately one half the available supply voltage appears across the collector-emitter junction of each device. The emitter terminals of the transistors are therefore nominally biased to approximately one half the supply voltage. The base terminal of each transistor is connected such that, for an input signal more positive than one half the supply voltage, one of the transistors supplies load current, and for an input signal more negative than one half the supply voltage, the other of the transistors supplies load current, i.e., only one transistor at a time supplies load current.

A problem associated with complementary symmetry amplifiers is that the base-emitter diode voltage drop of each transistor must be overcome before the transistor can conduct. In silicon transistors of the type commonly used, approximately 0.7 volt is required to overcome the base-emitter voltage drop. As the input signal voltage changes from a level above one half the supply voltage to a level below one half the supply voltage, there is a narrow range over which neither of the output transistors is conducting. This results in a flat spot on the transistor transfer characteristic which adversely affects the amplifier output and creates a problem known as crossover distortion. In a television receiver, such crossover distortion in the vertical sweep output amplifier is visibly noticeable as a white line across the face of the picture tube.

Various circuits have been devised heretofore to avoid the problem of crossover distortion. Notably among these are feedback arrangements and numerous voltage divider networks for developing the necessary 0.7 volt to bias each of the transistors slightly into conduction. The feedback methods of preventing crossover distortion, which require a feedback network, have proven unacceptable because of the frequency requirements of the feedback network. Most of the distortion correction schemes have therefore utilized various methods of biasing the two complementary transistors. In general, these biasing techniques utilize a plurality of resistors or a combination of diodes and resistors to cause a small bias current to flow into the base of one transistor and out through the base of the other transistor. This type of circuit causes a quiescent current to flow through the collector-emitter path of the two transistors. The foregoing type of circuit suffers from the likelihood of thermal runaway since any increase in temperature of the active devices causes the quiescent current to increase thereby further increasing the temperature within the devices and again increasing the quiescent current. Prior art attempts have been made to overcome this thermal runaway problem by carefully matching the complementary transistors with diodes and/or biasing transistors such that the changes in the temperature of the output devices is compensated for by changes in the temperature of the biasing devices. This technique has been only partially successful since it requires that the biasing devices and the output devices be mounted on a common heat sink and that they be carefully matched one to the other. Failure of any one of the devices therefore requires that extreme care be taken in either the selection of a replacement device or requires so that all of the devices be replaced with a matched set in order to prevent thermal runaway and crossover distortion.

Accordingly, it is an object of the present invention to provide a biasing arrangement for a complementary symmetry transistor amplifier which is thermally stable and substantially reduces crossover distortion.

It is a further object of the present invention to provide a biasing arrangement of a complementary symmetry transistor amplifier in which the active devices may be discretely replaced without regard to matching of components.

Another object of the present invention is to provide a biasing arrangement for a complementary symmetry transistor amplifier in which a common heat sink is not required to provide thermal stability.

In accordance with the present invention, in a complementary symmetry amplifier utilizing transistors of opposite conductivity for output devices wherein the emitter electrodes of the transistors are interconnected to form the common output terminal and the collector electrodes are coupled across a power supply, there is provided a biasing circuit comprising a control transistor and a resistor network coupled in parallel with the control transistor to provide bias voltage to the base electrodes of the amplifier transistors. The control transistor has its base electrode connected to the base of one of the amplifier transistors and an output electrode connected to the base of the other of the amplifier transistors. The resistor network is arranged such that a first element is connected between the emitter and collector terminals of the control transistor. Input signals are applied to one terminal of the control transistor and a biasing current is supplied from a constant current source to the resistor network to develop a voltage across the first resistor element. This bias voltage is just sufficient to turn on the two complementary output transistors. The base current which is drawn by the first output transistor also flows through the base circuit of the control transistor thereby effecting the conduction of the control transistor. Increased conduction of the control transistor reduces the bias voltage appearing across the first resistor element which in turn reduces the bias for the two output transistors. A quiescent level of output current is accordingly reached which depends upon the parameters of the three transistors.

For a better understanding of the present invention, reference may be had to the following description taken in conjunction with the accompanying drawing in which the single FIGURE shows a schematic diagram of a complemetary amplifier incorporating the biasing circuit of the present invention.

DETAILED DESCRIPTION OF THE INVENTION

Referring now to the FIGURE, there is shown an electrical circuit arrangement according to the present invention in which a pair of complementary transistors 10 and 12 are connected to deliver power through a capacitor 14 to a load 16. Transistor 10 is an NPN type and has its collector terminal connected to a source of positive voltage +V. Transistor 12 is a PNP type and has its collector terminal connected to the power supply common or ground terminal 18. The emitter of transistor 10 is connected to the emitter of transistor 12 at a common junction 20 to which capacitor 14 is connected.

Biasing for transistors 10 and 12 is provided by a biasing amplifier, herein shown as a single control transistor 22 in combination with a resistor network comprising resistors 24 and 26. Although resistors are shown, the resistor network may comprise other suitable types of impedance elements. Transistor 22 is of a PNP type and has its base terminal connected to the base terminal of transistor 10 and its collector terminal connected to the base terminal of transistor 12. Resistor 24 is connected between the emitter and collector terminals of transistor 22, and resistor 26 is connected from the collector terminal of transistor 22 to ground terminal 18. A smoothing capacitor 28 is connected in parallel with resistor 24.

A current source indicated by dashed line 30 is connected to supply biasing current to the emitter terminal of transistor 22. As shown, current source 30 may comprise an appropriately biased transistor 32 having its emitter terminal connected to voltage source +V and its collector terminal connected to the emitter terminal of transistor 22. Current source 30 also includes an input terminal 34 connected to the base of transistor 32. Terminal 34 forms a means to receive an input signal which is to be amplified and supplied to load 16 by transistors 10 and 12.

In operation, current source 30 is adjusted such that a small current is caused to flow through the resistor network comprising resistors 24 and 26 to ground. This current develops a voltage across resistor 24 which is of a polarity and of sufficient amplitude to just overcome the emitter-base, base-emitter and emitter-base diode voltage drops of transistors 22, 10, and 12 so that these three transistors are biased into conduction. Resistor 24 is selected in conjunction with the level of the constant current supply to provide a bias voltage sufficient to overcome the maximum combined $V_{be}$. The degree of conduction of transistors 10 and 12, i.e., the amount of bias current drawn, is a function of the $V_{be}$ of each transistor and its beta. This current also flows in the emitter-base path of the transistor 22 which acts as a variable resistor across resistor 24 to adjust the bias voltage to limit the current drawn by the output transistors thereby eliminating the thermal runaway problem. The current at which the bias network stabilizes at may be referred to as the quiescent current. The higher the gain of the control transistor and the lower the gain of the directly controlled output transistor, the lower the bias current required by the output transistors. This is the ideal condition for the quiescent current. Capacitor 28 is utilized to smooth the transition when transistor 22 begins to conduct.

Consider now the situation where the circuit values have been selected such that at the crossover point transistor 10 and transistor 12 are just barely conducting, this being the ideal situation in order that crossover distortion can be avoided and so that thermal runaway is under control. If transistor 10 is now replaced with another transistor having a lower base-emitter voltage drop, the tendency would be for transistor 10 to draw a much larger base current potentially endangering its reliability due to the likelihood of thermal runaway. However, because the transistor attempts to draw a heavier base current and since this base current must also flow through the emitter and base of transistor 22, current flow through the emitter-collector junction of transistor 22 is increased thereby reducing the voltage appearing across resistor 24. This reduced voltage will result in lower bias voltage for transistor 10, and with this lower bias voltage a lower base current begins to flow in transistor 10 thereby compensating for the lower base-emitter voltage drop of the new transistor 10. It can therefore be seen that for any change in either transistors 10, 12 or 22, a compensating bias current will be caused to flow and will establish a quiescent level of operation of the complementary amplifier which will prevent thermal runaway while maintaining conduction to eliminate crossover distortion.

As will be obvious to those having ordinary skill in the art, the present invention provides a biasing arrangement for a complementary symmetry amplifier which eliminates crossover distortion and obviates the thermal runaway problem and at the same time provides a circuit in which the discrete devices may be replaced without regard to matching of the characteristics of the devices or by use of a common heat sink.

Altough a single embodiment has been illustrated, it will be obvious that certain changes may be made without departing from the spirit and scope of the invention. For example, the biasing transistor may be replaced by a Darlington network or other type of amplifier and the circuit may be inverted whereby transistor 12 is arranged with its base terminal connected to the base terminal of an NPN control transistor. It is therefore intended that the appended claims shall cover such modifications as do not depart from the spirit and scope of the invention.

What is claimed as new and desired to be secured by Letters Patent of the United States is:

1. In a television receiver vertical sweep output circuit, a complementary symmetry amplifier comprising:
    first and second transistors interconnected in a complementary symmetry manner to create a common output for supplying load current in response to an input signal applied to said first and second transistors,
    means for generating a bias voltage including filter means responsive to said input signal for eliminating crossover distortion effects from said load current, and
    control means connected across said filter means and responsive to the bias current drawn by said first and second transistors to regulate said bias voltage as a function of said bias current.

2. The inventon recited in claim 1 wherein said filter means comprises capacitor means in parallel circuit combination with resistor means.

3. The invention recited in claim 2 wherein said control means comprises a third transistor having its base terminal connected to the base terminal of one of said first and second transistors and the emitter and collector terminals thereof connected across said filter means to limit said bias voltage as an inverse function of bias current drawn by said first and second transistors.

\* \* \* \* \*